United States Patent
Burbach

(10) Patent No.: US 6,656,825 B2
(45) Date of Patent: Dec. 2, 2003

(54) SEMICONDUCTOR DEVICE HAVING AN IMPROVED LOCAL INTERCONNECT STRUCTURE AND A METHOD FOR FORMING SUCH A DEVICE

(75) Inventor: Gert Burbach, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/285,004

(22) Filed: Oct. 31, 2002

(65) Prior Publication Data

US 2003/0201490 A1 Oct. 30, 2003

(30) Foreign Application Priority Data

Apr. 30, 2002 (DE) .......................................... 102 19 361

(51) Int. Cl.[7] .......................................... H01L 21/3205
(52) U.S. Cl. ........................ 438/596; 438/586; 438/673
(58) Field of Search ................................ 438/596, 673, 438/586, FOR 196

(56) References Cited

U.S. PATENT DOCUMENTS

| | | | |
|---|---|---|---|
| 5,208,472 A | | 5/1993 | Su et al. |
| 5,804,472 A | * | 9/1998 | Balasinski et al. .......... 438/158 |
| 6,090,693 A | * | 7/2000 | Gonzalez et al. ........... 438/592 |
| 6,365,454 B1 | * | 4/2002 | Lee et al. .................... 438/255 |

FOREIGN PATENT DOCUMENTS

| | | | |
|---|---|---|---|
| DE | 69226987 T2 | 2/1999 | ......... H01L/21/768 |
| DE | 4339919 C2 | 3/1999 | ......... H01L/21/283 |
| DE | 19849745 A1 | 1/2000 | ......... H01L/21/768 |

* cited by examiner

Primary Examiner—George Fourson
Assistant Examiner—Thanh V Pham
(74) Attorney, Agent, or Firm—Williams, Morgan & Amerson, P.C.

(57) ABSTRACT

In a semiconductor device including one or more semiconductor containing lines, such as gate electrodes of transistor elements, and/or active areas, sidewall spacer elements of the one or more semiconductor containing lines include a conductive layer that also covers a surface portion of the lines and extends to another semiconductor containing line or an active region to serve as a local interconnect. The sidewall spacer process sequence is modified to obtain the local interconnects along with the sidewall spacers without unduly contributing to process complexity. The conductive layers in the sidewall spacer elements, which may preferably comprise a metal, significantly improve the overall conductivity of these lines. Thus, the present invention offers increased design flexibility and the potential of increasing feature density.

24 Claims, 4 Drawing Sheets

SEMICONDUCTOR DEVICE HAVING AN IMPROVED LOCAL INTERCONNECT STRUCTURE AND A METHOD FOR FORMING SUCH A DEVICE

BACKGROUND OF THE INVENTION

1. Field of the Invention

The present invention generally relates to the field of manufacturing integrated circuits, and, more particularly, to the formation of semiconductor devices including field effect transistors, resistors, capacitors and the like, wherein closely spaced individual circuit elements are connected by local interconnects.

2. Description of the Related Art

In steadily increasing the performance of integrated circuits and decreasing the size thereof, the individual circuit elements have continuously been reduced in size. Currently, critical feature sizes of 0.13 $\mu$m and beyond are accomplished. Besides steadily decreasing the feature sizes, it is, however, of great importance to provide for an efficient connection of the individual circuit elements to establish the required functionality of the circuit. Thus, the chip area required to manufacture a circuit primarily depends on the size of the required interconnect lines rather than on the dimensions of the circuit elements, such as transistors, resistors and the like. It is thus common practice to provide a plurality of overlying wiring levels, also referred to as metallization layers, in which trenches and vias, filled with an appropriate metal, provide for the required conductive connections, also referred to as interconnects. Since each additional metallization layer significantly contributes to process complexity, semiconductor manufacturers are steadily seeking for improvements in view of reducing the number of metallization layers required for interconnecting the semiconductor elements. Reducing the number of metallization layers, however, requires one to steadily reduce the dimension of the respective conductive lines and vias to save on chip area so as to allow the fabrication of a greater number of interconnects on a single metallization layer.

Generally, reducing the dimensions of the conductive lines and vias also results in an associated increase in the electrical resistance of the lines and vias. One approach to counteract this increase in resistance is to replace the frequently used metallization metal aluminum with copper, which exhibits a significantly lower resistance than aluminum. Further progress in increasing interconnect density has been made by the introduction of so-called local interconnects, wherein closely-spaced or adjacent individual elements may directly be connected without providing an interlayer dielectric that requires the formation of vias and trenches in the dielectric layer to connect these devices.

Several approaches have been proposed and are currently realized in forming local interconnects. However, a compromise between process complexity and functionality of the local interconnects usually has to be made. While, from a functional point of view, a highly conductive material is desirable, integration of an according metallization process has been proven to add an undue amount of process complexity. It has thus become a frequently preferred technique to provide local interconnects as polysilicon features that are formed together with gate electrodes of the field effect transistors so that these local interconnects and any polysilicon lines that may connect various chip areas exhibit substantially the same conductivity as the gate electrodes of the field effect transistors. Since these polysilicon lines and the local interconnects, although heavily doped, exhibit a relatively high electrical resistance, these circuit features may not be scaled down in the same manner as, for example, gate electrodes, since otherwise signal propagation delay would be restricted by local interconnects and polysilicon runners rather than by the transistor devices.

In other approaches, closely-spaced semiconductor regions, such as a gate electrode and a source or a drain region of the transistor, may be connected after the formation of the transistor device by depositing a refractory metal that is patterned by an appropriate local interconnect mask to provide for the desired connection. Although this approach offers highly conductive local interconnects compared to polysilicon-based interconnects, a plurality of additional process steps, such as a plurality of deposition and etch steps, is required, thereby adding to process complexity.

In view of the situation pointed out above, there exists a need for an improved technique for forming local interconnect structures providing for low resistivity while not unduly contributing to process complexity.

SUMMARY OF THE INVENTION

Generally, the present invention is directed to devices and methods in which the conventional sidewall spacer technique used for achieving a desired dopant profile in the drain and source regions of field effect transistors is modified in such a way that the sidewall spacers include a highly conductive layer that is separated from an underlying area by a dielectric layer. This highly conductive layer is also patterned to provide for the required local interconnect between closely-spaced features, for example, between a gate electrode and an adjacent active area, such as a drain or a source region of the same or an adjacent transistor element. Moreover, any device features that are patterned along with the gate electrodes of the field effect transistors, such as any polysilicon runners, will also receive the sidewall spacers including the highly conductive layer so that the electrical resistance of these polysilicon runners may be significantly reduced due to being shunted by the highly conductive spacer layer.

According to one illustrative embodiment of the present invention, a semiconductor device comprises a substrate having a semiconductor layer provided thereon, wherein the semiconductor layer includes a first active region and a second active region with the first and second active regions being separated by an insulating region. A semiconductor containing line is provided and has sidewalls and an upper surface, wherein the semiconductor containing line is located at least partially above the first active region. A dielectric layer is formed adjacent to the sidewalls of the semiconductor containing line and is in contact therewith. Moreover, the semiconductor device comprises a conductive layer formed adjacent to the dielectric layer and on a portion of the upper surface, wherein the conductive layer includes an interconnect extension portion formed partially on the insulating region and the second active region to form a local interconnect.

According to a further illustrative embodiment of the present invention, a semiconductor device comprises a substrate having a semiconductor layer provided thereon, wherein the semiconductor layer includes an active region and an insulating region. A first semiconductor containing line is located above the insulating region and has sidewalls and an upper surface. A second semiconductor containing line is located on the insulating region, spaced apart from the first semiconductor containing line and having sidewalls and an upper surface, wherein the first and second semiconductor containing lines each includes a dielectric layer formed on the respective sidewalls of the first and second semiconductor containing lines. The semiconductor device further comprises a conductive layer formed adjacent to the dielectric layer and on respective portions of the upper surfaces of the first and second semiconductor containing lines, wherein the conductive layer further includes an interconnect extension portion formed on the insulating region and connecting the first and second semiconductor containing lines.

According to a further embodiment of the present invention, a field effect transistor comprises a drain and a source region formed in an active region and a gate electrode formed over the active region and separated therefrom by a gate insulation layer, wherein the gate electrode has sidewalls and an upper surface. The field effect transistor further includes spacer elements formed adjacent to the sidewalls, wherein the spacer elements comprise a dielectric layer and a metal containing layer. The dielectric layer insulates the metal containing layer from the active region.

Pursuant to a further illustrative embodiment of the present invention, a method of forming a local interconnect comprises providing a substrate having formed thereabove a semiconductor containing line. Thereafter, a first dielectric layer is formed over the substrate and is patterned to expose a contact area on the semiconductor containing line. A conductive layer is deposited over the substrate and a second dielectric layer is deposited on the conductive layer. The method further includes forming a mask layer to cover a portion of the contact area, and anisotropically etching regions not covered by the mask layer to form a conductive sidewall spacer on the sidewalls of the semiconductor containing line and a local interconnect in the contact area.

In another embodiment of the present invention, a method of forming a local interconnect in a semiconductor device comprises providing a substrate having formed thereabove a semiconductor containing line and forming a first dielectric layer over the substrate. Moreover, the first dielectric layer is patterned so as to expose at least a portion of the first dielectric layer formed on the semiconductor containing line. A conductive layer is deposited over the substrate and a mask layer is formed over the substrate covering a portion of the contact area. The conductive layer is anisotropically etched to form a first sidewall spacer on sidewalls of the semiconductor containing line. Next, an ion implantation is performed to define source and drain extension areas adjacent to the semiconductor containing line, wherein the first sidewall spacers serve as an implantation mask. A second dielectric layer is deposited over the substrate and is anisotropically etched to form second sidewall spacers, wherein the portion of the conductive layer formed in the contact area serves as the local interconnect.

In yet another embodiment of the present invention, a method of forming a local interconnect in a semiconductor device comprises providing a substrate having formed thereabove a semiconductor containing line and forming first dielectric sidewall spacers at the sidewalls of the semiconductor containing line. A first dielectric layer is deposited and patterned to expose a contact area on the semiconductor line. A conductive layer is deposited and a mask layer is formed to cover a portion of the contact area. Additionally, conductive sidewall spacers and the local interconnect are formed by anisotropically etching the conductive layer.

BRIEF DESCRIPTION OF THE DRAWINGS

The invention may be understood by reference to the following description taken in conjunction with the accompanying drawings, in which like reference numerals identify like elements, and in which.

Figure 1A:
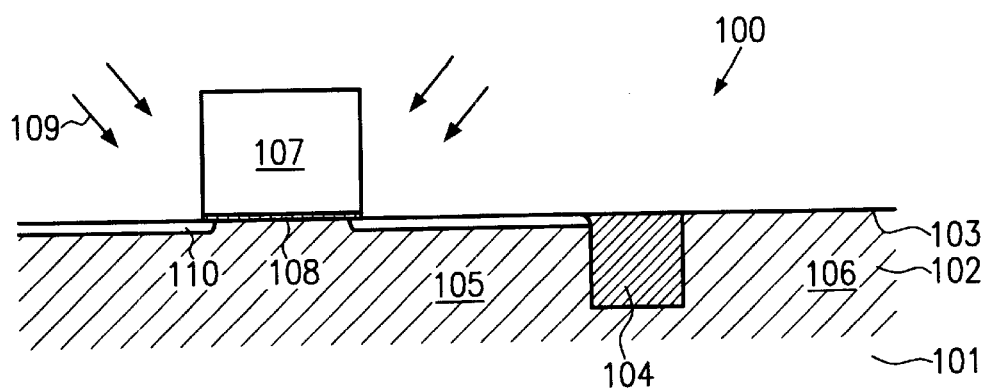
FIGS. 1a–1h schematically show, in a simplified manner, a semiconductor device at various manufacturing stages according to one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Moreover, although the illustrative embodiments described herein below refer to semiconductor devices based on silicon technology, it is to be noted that the principles exemplified herein are also applicable to any semiconductor material, such as germanium, III–V semiconductors, or II–VI semiconductors, as well as for a semiconductor device fabricated on an insulating substrate, such as silicon-on-insulator (SOI) devices or other semiconductor materials deposited on an appropriate substrate. Furthermore, reference will be made herein to field effect transistors and polysilicon lines, whereas it is to be understood that the principles described below may be applied to any circuit topology, such as a CMOS, an NMOS, a PMOS, a mixed MOS-bipolar architecture, and the like.

With reference to FIGS. 1a–1h, representative embodiments of the present invention will now be described. In FIG. 1a, a semiconductor device 100 comprises a substrate 101 including a semiconductor containing layer 102 having a surface 103. As already pointed out, the substrate 101 may be any appropriate substrate. In the present example, it is referred to as a silicon substrate that may have the semiconductor layer 102 formed by, for example, epitaxial growth to improve the crystalline characteristics of the semiconductor layer 102 in and on which a circuit element such as a field effect transistor is to be formed. The semiconductor layer 102 includes a shallow trench isolation (STI) 104 that separates a first active region 105 from a second active region 106. Over the first active region 105, a semiconductor containing line 107 is formed, which, in this example, may represent a gate electrode of a field effect transistor to be formed. The gate electrode 107 is electrically insulated from the first active region 105 by a gate insulation layer 108 that may be formed from any appropriate material, such as silicon dioxide, silicon nitride, silicon oxynitride, etc., when a silicon-based field effect transistor is to be formed.

FIG. 1a shows the semiconductor device 100 at the stage when a first implantation step is to be carried out so as to define in a first step a halo implant region for the source and drain regions to be formed. The implantation may be performed at a tilt angle, as indicated by the arrows 109. It should be noted that a plurality of implantation steps have already been carried out for defining the first active region 105 and the second active region 106 to obtain a required dopant profile in these regions. Moreover, depending on the type of active region required, i.e., N-well or P-well, the implantation indicated by 109 may be performed on the first active region 105 and the second active region 106 separately by using a resist mask (not shown in FIG. 1a).

Figure 1B:
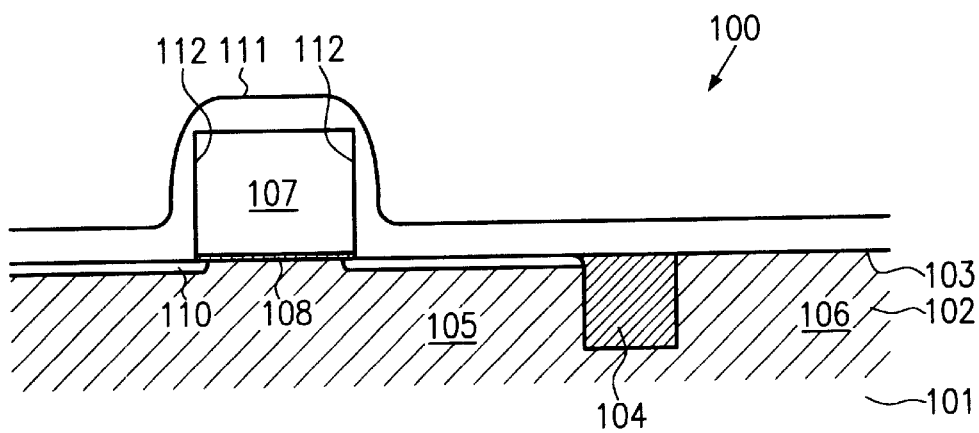

FIG. 1b shows a schematic cross-sectional view of the semiconductor device 100 at an advanced manufacturing stage. By means of the implantation 109, lightly doped regions 110 are formed in the first active region 105, wherein the degree of overlap with the gate electrode 107 is determined by the implantation parameters, such as the tilt angle, type of dopants, and energy of the dopants. Moreover, a dielectric layer 111 is formed over the substrate 101 and particularly covers sidewalls 112 of the gate electrode 107. The dielectric layer 111 may comprise any appropriate material, such as silicon dioxide, silicon nitride, silicon oxynitride or any other material that may be appropriate for the semiconductor material used for the formation of the semiconductor device 100. Suitable deposition methods are well known in the art and may include chemical vapor deposition (CVD), physical vapor deposition (PVD) or, when an oxide is considered appropriate, an oxidation process may be carried out. The thickness of the dielectric layer 111 is selected in accordance with process requirements, as this layer may be used as an implantation mask for a further implantation, as will be explained with reference to FIG. 1c.

Figure 1C:
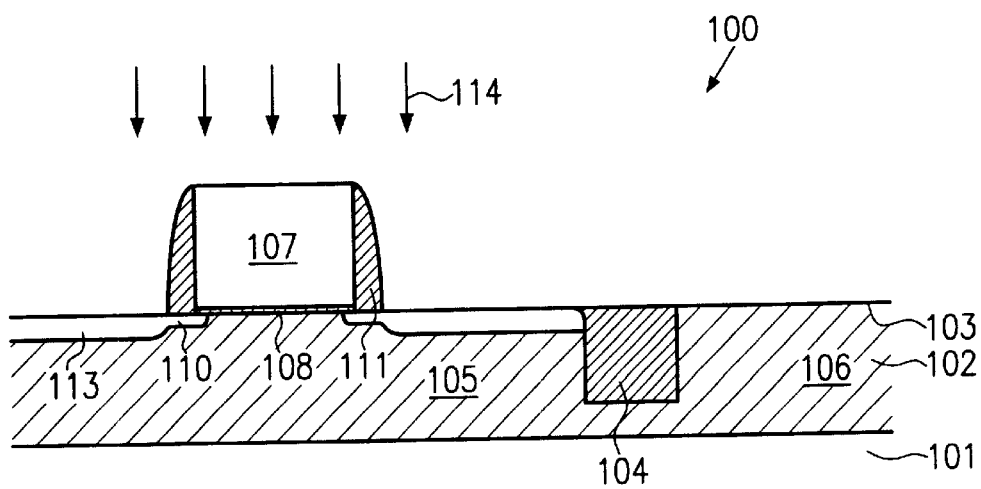

In FIG. 1c, the semiconductor device 100 is schematically depicted in a cross-sectional view after an anisotropic etch process has been performed to remove the dielectric layer 111, except for the sidewalls 112. In FIG. 1c, reference number 111 is also used for the remaining portion of the dielectric layer which will also be referred to as first spacer 111. Anisotropic etch techniques are well known in the art and may include reactive ion etching, plasma enhanced etching, and the like. In FIG. 1c, the semiconductor device 100 is subjected to a further implantation step, indicated as 114, to form so-called source and drain extension regions 113 to tailor the source and drain dopant profile of the field effect transistor to be formed. During the implantation 114, the first spacer 111 acts as an implantation mask so that the previously implanted halo region 110 is effectively protected. As noted before, the implantation 114 in the first active region 105 and the second active region 106 may be performed separately or the active region 106 may not be subject to an implantation, depending on process requirements.

In one illustrative embodiment, the implantation 114 may be carried out without parameters may be selected so as to take into account the thickness of the dielectric layer 111 overlying the active region 105 so that the required dopant profile is obtained, even though the ions have to pass through the dielectric layer 111.

Figure 1D:
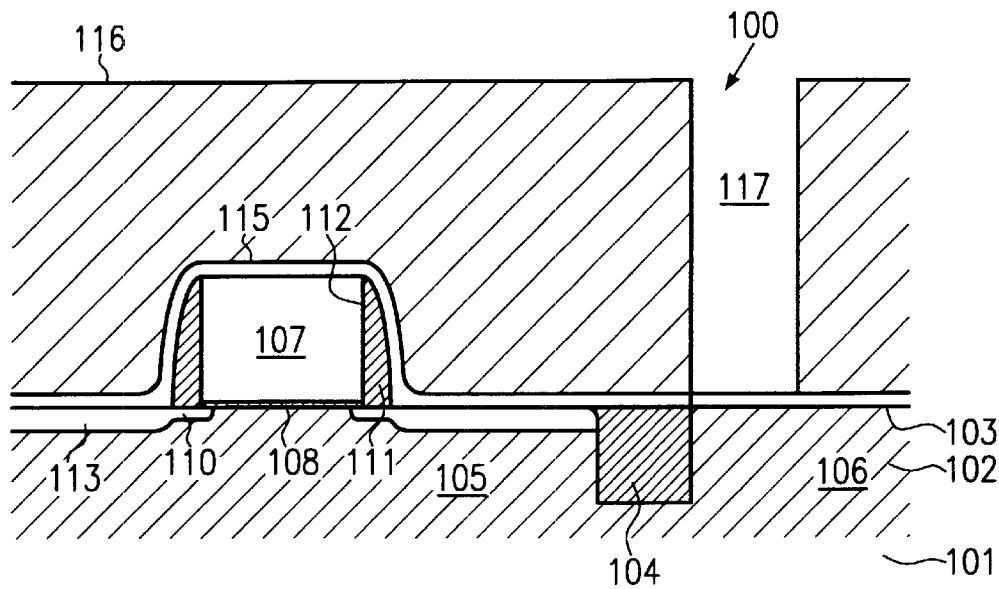

In FIG. 1d, the semiconductor device 100 of FIG. 1c is schematically depicted in an advanced manufacturing stage. In FIG. 1d, a second dielectric layer 115 is formed over the substrate and covers the first active region 105, the second active region 106 and the gate electrode 107 including the first sidewall spacer 111. The second dielectric layer 115 may be formed of any appropriate material, such as silicon dioxide, silicon nitride, silicon oxynitride or any other appropriate material suitable for the semiconductor material used and in conformity with process requirements. The thickness of the second dielectric layer 115 is selected to provide the required electrical insulation to the underlying first active region 105. Typically, a thickness may range from approximately 20–200 nm. Regarding the formation of the second dielectric layer 115, the same criteria apply as pointed out with reference to the dielectric layer 111.

Moreover, a mask layer 116 is formed over the substrate 101 covering those portions of the substrate 101 on which the second dielectric layer 115 shall be maintained. The mask layer 116 comprises an opening 117 for exposing a contact area in which the second dielectric layer 115 is to be removed to form a local interconnect.

Figure 1E:
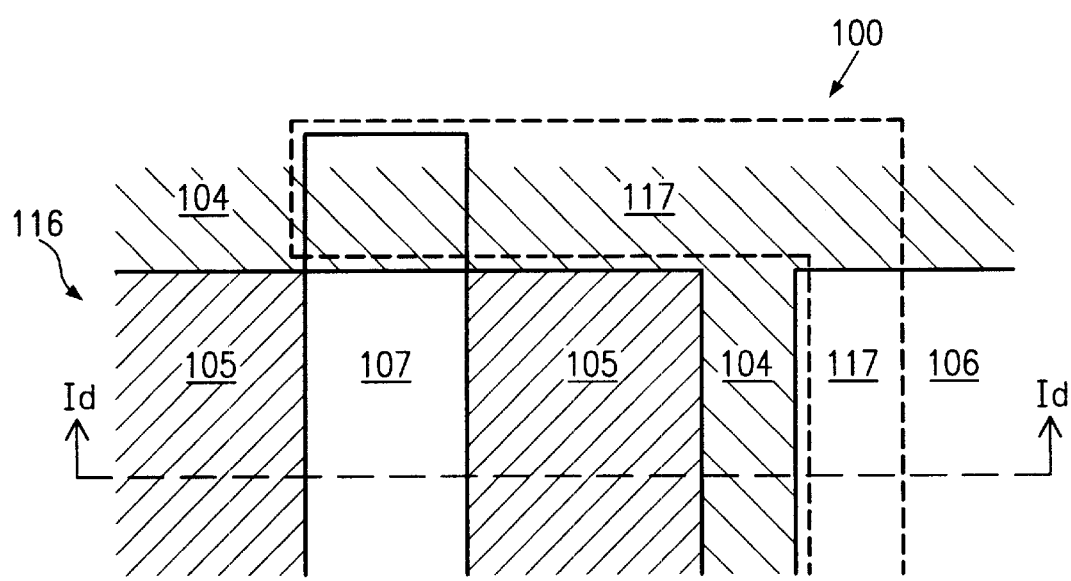

FIG. 1e shows a plan view of the semiconductor 100 as depicted in FIG. 1d. For the sake of clarity, the mask layer 116 and the second dielectric layer 115 are considered transparent so that the underlying features are depicted, such as the first and second active regions 105, 106 and the gate electrode 107. The dashed line in FIG. 1e represents the opening 117 that exposes a portion of the second active region 106, a portion of the shallow trench isolation 104, and a portion of the gate electrode 107 overlying the shallow trench isolation 104. Thus, the opening 117 represents the contact area in which the local interconnect for connecting the second active region 106 with the gate electrode 107 is to be formed. It is clear from FIG. 1e that the gate electrode 107 is connected to the second active region 106 without providing a short to the first active region 105.

Again referring to FIG. 1d and FIG. 1b, as previously discussed, when the first dielectric layer 111 in FIG. 1b is not anisotropically etched, the second dielectric layer 115 may not be provided or may be provided with a reduced thickness sufficient for ensuring the required electrical insulation to the underlying active region 105, when an integrity concern exists regarding the implanted ions in the dielectric layer 111. Irrespective, whether the second dielectric layer 115 is provided or not, or is provided with a reduced thickness, the resist mask 116 having the opening 117 is then formed in the same way as illustrated in FIGS. 1d and 1e. The mask layer 116 may be a resist mask deposited by well known techniques and is patterned by standard photolithography.

Figure 1F:
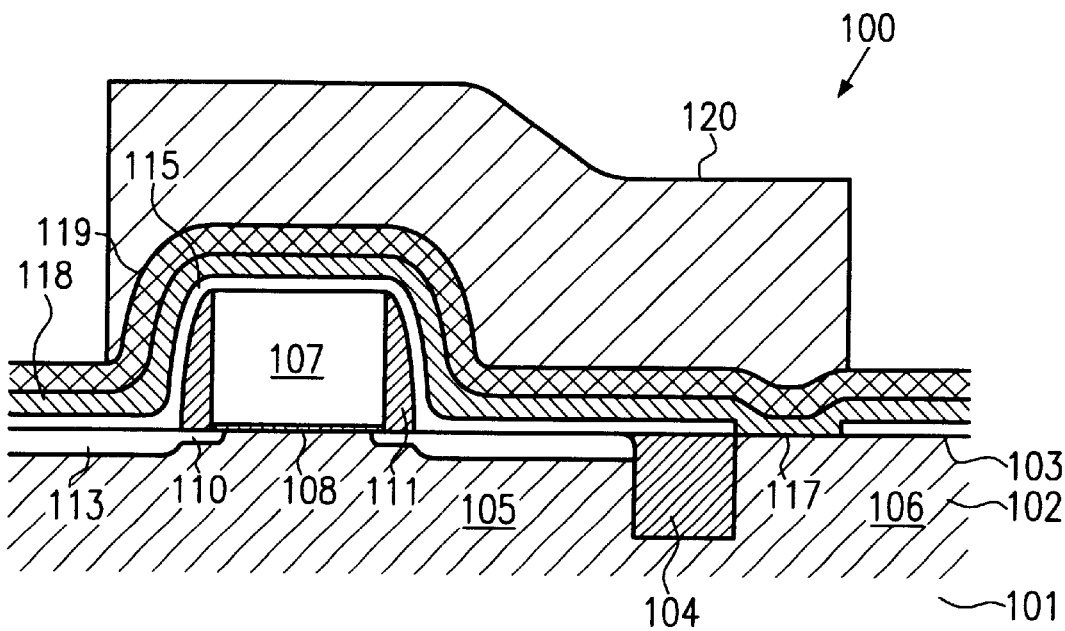

FIG. 1f schematically shows the semiconductor device 100 in a further advanced manufacturing stage. In FIG. 1f, the second dielectric layer 115 has been removed in the opening 117 (see FIGS. 1d and 1e) to expose the contact area, which herein below will also be noted by reference number 117. Moreover, a conductive layer 118 is formed over the substrate 101 and, in particular, covers the contact area 117. A thickness of the conductive layer may be selected in conformity with the material used and design requirements, and may, for instance be within approximately 50–500 nm. The conductive layer 118 may be formed of any appropriate conductive material, such as a refractory metal such as aluminum, copper, titanium, tantalum, tungsten, cobalt, and the like, or may be a compound of two or more materials, such as a metal silicide, for example a silicide of the refractory metals listed above. In some embodiments, the conductive layer 118 may be a heavily doped semiconductor material, such as polysilicon, where the dopant concentration within the semiconductor material is selected to provide for the required conductivity. In other embodiments, the conductive layer 118 may be comprised of two or more sub layers each formed from a different material. For example, a relatively thin barrier layer may be formed in contact with the second dielectric layer 115 and the contact area 117, when a subsequent sub layer exhibits diffusion characteristics that may not be acceptable in view of process requirements. Consequently, a titanium sub layer, a titanium nitride sub layer, a tantalum sub layer, and the like may be provided in combination with a bulk layer, for example a tungsten layer. In any case, the material composition of the conductive layer 118 is preferably selected so as to yield an electrical resistance that is significantly less than the electrical resistance of the gate electrode 107 to provide for a low ohmic local interconnect.

A third dielectric layer 119 is formed over the conductive layer 118 and a second mask layer 120 is formed over the third dielectric layer 119 in such a manner that the contact area 117 is covered. That is, the mask layer 120 may be a negative image of the mask layer 116 depicted in FIGS. 1d and 1e.

The conductive layer 118 may be formed by any appropriate deposition method, such as chemical vapor deposition or physical vapor deposition, which is preferable when the conductive layer includes one or more metals. Moreover, the conductive layer 118 may be formed by depositing a refractory metal and subsequently a silicon layer and performing an anneal process to convert the metal and the silicon into a metal silicide. The thickness of the conductive layer 118 may be selected in view of the required electrical conductivity. Preferably, a thickness is selected, depending on the type of material, that ensures a minimum required electrical conductivity. Since the conductive layer 118 and the third dielectric layer 119, in combination with the second dielectric layer 115 and possibly with the first sidewall spacer 111, will serve as an implantation mask for a subsequent implantation step to define the heavily doped source and drain regions, the overall lateral extension of the finally obtained spacer 140 (see FIG. 1b) may be adjusted by appropriately selecting the layer thickness of the third dielectric layer 119. Thus, the thickness of the conductive layer 118 may exclusively be selected with respect to the required conductivity as long as it is ensured that the resulting thickness of the conductive layer 118 does not exceed the required lateral extension of the sidewall spacers to be formed. Regarding the formation of the third dielectric layer 119, the same criteria apply as pointed out with reference to the dielectric layer 111 and the second dielectric layer 115.

The mask layer 120 may be a resist mask deposited and patterned by well known techniques. In one embodiment, the same mask may be used as in the case of forming the mask layer 116 (see FIGS. 1d and 1e), wherein, however, contrary to the mask layer 116, a resist may be used that hardens upon exposure.

Figure 1G:
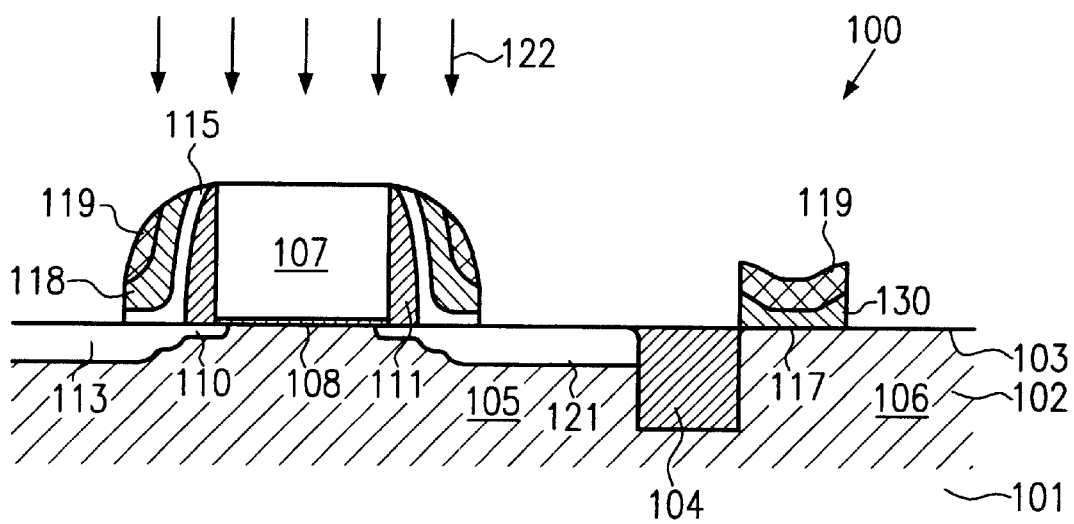

FIG. 1g shows the semiconductor device 100 after anisotropically etching the substrate 101, wherein the mask layer 120 has been used as an etch mask, and after the mask layer 120 has been removed. The semiconductor device 100 comprises a second sidewall spacer 140 including the second dielectric layer 115, the conductive layer 118 and the third dielectric layer 119. Moreover, a local interconnect 130, i.e., the remaining portion of the conductive layer 118, is formed on the contact area 117 and is covered by the remaining third dielectric layer 119. A further implantation, indicated by 122, is carried out to define heavily doped source and drain regions 121, wherein the second sidewall spacer 140 acts as an implantation mask. It should be noted that, for the sake of convenience, in the cross-section of FIG. 1g, those portions of the local interconnect 130 are not depicted that are formed on the shallow trench isolation 104 and the portion of the gate electrode overlying the shallow trench isolation 104 (see FIG. 1e).

Figure 1H:
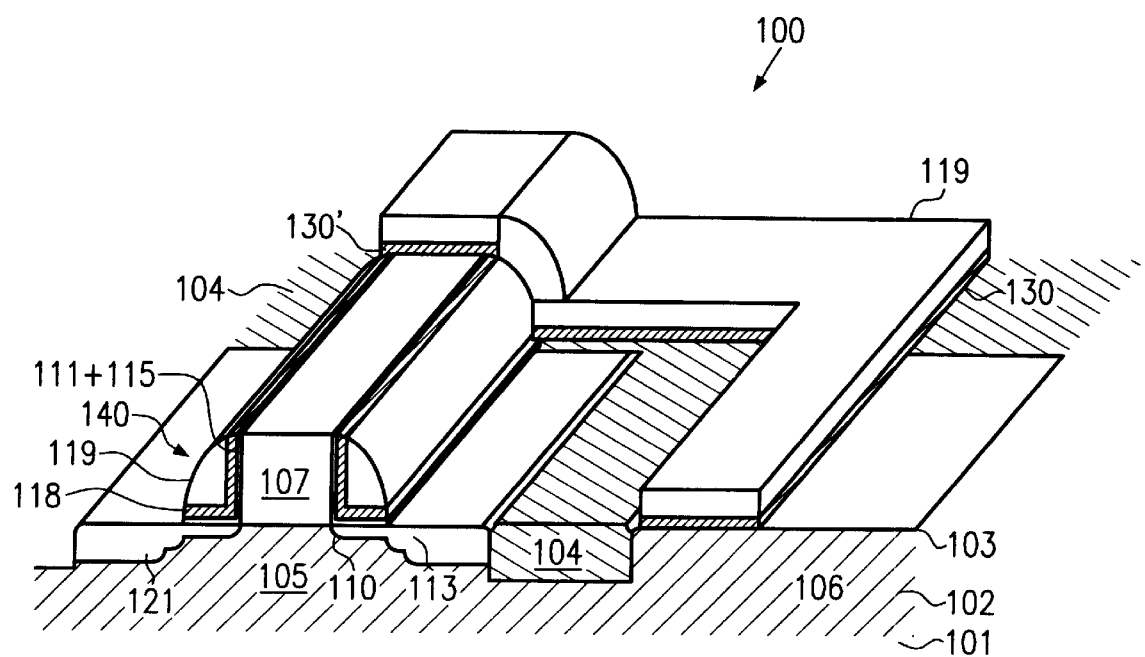

FIG. 1h schematically shows a perspective and simplified view of the semiconductor device 100 similar to the device 100 shown in FIG. 1g. FIG. 1h shows that the local interconnect 130 connects the second active region 106 with the gate electrode 107 at a surface portion 130' and also with the conductive layer 118 within the second side wall spacer 140. If the second active region 106 is the source or drain region of an adjacent transistor element, the local interconnect 130 provides for a low resistivity connection between the gate electrode 107 and the adjacent transistor element.

In another embodiment, the gate electrode 107 may represent a semiconductor containing line that is entirely located over electrically insulating areas, such as the shallow trench isolation region 104, to connect different chip areas or specific circuit elements. Although the conductive spacer 140 is not of great relevance for the electrical behavior of the gate electrode 107 when acting as a gate, in this case the gate electrode 107, acting as a semiconducting line, is shunted by the highly conductive layer 118 and thus the gate electrode resistance is significantly reduced, thereby remarkably improving device characteristics with respect to signal propagation delay and power consumption. Moreover, the provision of the highly conductive layer shunting the gate electrode 107, now acting as the semiconducting line, allows the dimensions of the semiconducting line to be reduced so that an increased line density is achievable while maintaining or even improving the electrical characteristics thereof. In other embodiments, two or more semiconducting lines, separated from each other, may be connected by local interconnects 130, as shown in FIG. 1h.

Again referring to FIG. 1f, in one embodiment, the conductive layer 118 may be deposited with a thickness in conformity with process requirements so as to obtain a desired dopant profile in the first active region 105, when a subsequent implantation step is carried out without depositing the third dielectric layer 119. That is, a second sidewall spacer (not shown) may be formed by anisotropically etching the conductive layer 118 with the second mask layer 120, prior to depositing the third dielectric layer 119. Thereafter, the third dielectric layer 119 is deposited, according to one embodiment, with the mask layer 120 removed, and according to a further embodiment, with the second mask layer 120 still in place. Next, the third dielectric layer 119 is anisotropically etched, wherein no selectivity to the conductive layer 118 is required when the second mask layer 120 has been maintained, whereas with the second mask layer removed, the anisotropic etch step is preferably selective to the conductive layer 118 to not unduly remove material at the contact area 117. Alternatively, after deposition of the third dielectric layer 119, a further mask layer identical to the second mask layer 120 may be deposited and patterned and an anisotropic etch step not requiring any selectivity to the conductive layer 118 may be carried out. Thereafter, the process flow may continue as depicted in FIG. 1g to obtain the local interconnect 130 as shown in FIG. 1h.

As a result, the present invention allows one to form local interconnects having a low resistivity by modifying the sidewall spacer sequence that is required to define an appropriate dopant concentration in the source and drain regions of field effect transistor elements, whereby at the same time any semiconductor containing lines formed simultaneously with gate electrodes of transistor elements receive a highly conductive "shunt" line which remarkably improves the electrical characteristics of these lines. Accordingly, the present invention increases the flexibility for circuit designers without unduly contributing to process complexity. Moreover, circuit density may be improved due to the superior electrical characteristics of the local interconnects and semiconductor containing lines shunted by highly conductive layers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a local interconnect, comprising:
   providing a substrate having formed thereabove a semiconductor containing line;
   depositing a first dielectric layer over the substrate;
   patterning the first dielectric layer to expose a contact area on the semiconductor containing line;
   depositing a conductive layer over the substrate;
   depositing a second dielectric layer on the conductive layer;
   forming a mask layer to cover a portion of said contact area; and
   anisotropically etching regions not covered by said mask layer to form a conductive sidewall spacer on the sidewalls of said semiconductor containing line and a local interconnect in said contact area.

2. The method of claim 1, further comprising performing an ion implantation step prior to patterning said first dielectric layer.

3. The method of claim 2, wherein forming said first dielectric layer and performing said ion implantation includes:
   depositing a first spacer layer prior to depositing said first dielectric layer; and
   anisotropically etching said first spacer layer to form a first sidewall spacer used as an implantation mask for the subsequent ion implantation.

4. The method of claim 1, further comprising performing a second ion implantation after anisotropically etching the regions not covered by said mask layer, wherein said conductive sidewall spacers serve as an implantation mask for the second ion implantation.

5. The method of claim 1, wherein a thickness of said conductive layer is controlled so as to obtain a cross-sectional area providing for a required minimum conductivity.

6. The method of claim 1, wherein the conductive layer comprises at least one metal.

7. The method of claim 6, wherein said at least one metal is a refractory metal.

8. The method of claim 1, wherein a thickness of said conductive layer and a thickness of said second dielectric layer are selected, in combination, so as to obtain a required lateral extension of said conductive sidewall spacers.

9. The method of claim 1, wherein said substrate includes an active region separated from said semiconductor containing line.

10. The method of claim 9, wherein said first dielectric layer is patterned so as to expose at least a portion of said active region.

11. A method of forming a local interconnect in a semiconductor device, the method comprising:
    providing a substrate having formed thereabove a semiconductor containing line;
    forming a first dielectric layer over the substrate;
    patterning the first dielectric layer to expose at least a portion of said first dielectric layer formed on the semiconductor containing line and a contract area;
    depositing a conductive layer over the substrate;
    forming a mask layer over the substrate so as to cover a portion of said contact area;
    anisotropically etching said conductive layer to form a first sidewall spacer on sidewalls of said semiconductor containing line;
    performing an ion implantation to define source and drain extension areas adjacent to the semiconductor containing line, wherein the first sidewall spacers serve as an implantation mask;
    depositing a second dielectric layer over the substrate; and
    anisotropically etching the second dielectric layer to form second sidewall spacers, wherein the portion of said conductive layer formed in said contact area serves as the local interconnect.

12. The method of claim 11, wherein said mask layer is removed prior to depositing said second dielectric layer.

13. The method of claim 11, wherein a third mask layer is formed prior to anisotropically etching said second dielectric layer to cover said contact area.

14. The method of claim 11, further comprising a second ion implantation to define source and drain extension regions, wherein said second sidewall spacers serve as an implantation mask.

15. The method of claim 11, wherein a thickness of said conductive layer is selected to obtain a required lateral extension of said first sidewall spacers.

16. The method of claim 11, wherein said conductive layer comprises at least one of a metal and a heavily doped semiconductor material.

17. The method of claim 16, wherein said metal comprises at least one of titanium, tantalum, tungsten and cobalt.

18. The method of claim 15, wherein said conductive layer includes one or more conductive sub layers of different materials.

19. The method of claim 11, wherein said first dielectric layer includes one or more dielectric sub layers of different materials.

20. A method of forming a local interconnect in a semiconductor device, the method comprising:
    providing a substrate having formed thereabove a semiconductor containing line;
    forming first dielectric sidewall spacers at the sidewalls of the semiconductor containing line;
    depositing a first dielectric layer;
    patterning the first dielectric layer to expose a contact area on said semiconductor containing line;
    depositing a conductive layer;
    forming a mask layer to cover a portion of said contact area; and
    forming conductive sidewall spacers and said local interconnect by anisotropically etching said conductive layer.

21. The method of claim 20, wherein said conductive layer includes one or more sub layers of different materials.

22. The method of claim 21, wherein at least one of said sub layers is a metal sub layer.

23. The method of claim 20, wherein said conductive layer comprises at least one of a doped semiconductor and a metal.

24. The method of claim 20, wherein depositing said conductive layer includes depositing a metal containing layer and further comprising depositing a dielectric layer.

* * * * *

UNITED STATES PATENT AND TRADEMARK OFFICE
CERTIFICATE OF CORRECTION

PATENT NO. : 6,656,825 B2
DATED : December 2, 2003
INVENTOR(S) : Gert Burbach

It is certified that error appears in the above-identified patent and that said Letters Patent is hereby corrected as shown below:

Column 9,
Line 67, "contract area" should be -- contact area --.

Signed and Sealed this

Thirteenth Day of January, 2004

JON W. DUDAS
*Acting Director of the United States Patent and Trademark Office*